United States Patent
Turnquist et al.

(10) Patent No.: US 9,397,662 B2
(45) Date of Patent: Jul. 19, 2016

(54) SEQUENTIAL CIRCUIT WITH CURRENT MODE ERROR DETECTION

(75) Inventors: Matthew Turnquist, Helsinki (FI); Lauri Koskinen, Helsinki (FI); Jani Mäkipää, Espoo (FI); Erkka Laulainen, Helsinki (FI)

(73) Assignee: Aalto University Foundation, Aalto (FI)

( * ) Notice: Subject to any disclaimer, the term of this patent is extended or adjusted under 35 U.S.C. 154(b) by 132 days.

(21) Appl. No.: 13/810,609

(22) PCT Filed: Jul. 13, 2011

(86) PCT No.: PCT/FI2011/050653
§ 371 (c)(1),
(2), (4) Date: Apr. 19, 2013

(87) PCT Pub. No.: WO2012/007643
PCT Pub. Date: Jan. 19, 2012

(65) Prior Publication Data
US 2013/0193999 A1 Aug. 1, 2013

Related U.S. Application Data

(60) Provisional application No. 61/364,819, filed on Jul. 16, 2010.

(51) Int. Cl.
*H03K 19/003* (2006.01)
*G01R 31/28* (2006.01)
(Continued)

(52) U.S. Cl.
CPC ........ *H03K 19/003* (2013.01); *G01R 31/31725* (2013.01); *H03K 3/012* (2013.01); *H03K 3/0375* (2013.01)

(58) Field of Classification Search
CPC ....... H03L 7/091; H03L 7/0814; H03L 7/087; H03L 7/10; H04L 7/033; H04L 25/0282; H04L 25/0294; H04L 7/0008; G01R 31/31725; G01R 31/318583; H03K 3/0375; H03K 5/26; H03K 19/01812; H03K 19/003; H03K 3/2885; H03K 3/012; H04J 3/0608

USPC ......... 714/724, 731, 740, 700, 815, 699, 701, 714/799, 744; 326/10, 16, 93; 716/4, 108, 716/136; 365/201, 72
See application file for complete search history.

(56) References Cited

U.S. PATENT DOCUMENTS 4,754,173 A * 6/1988 Smith et al. .................... 326/126
5,216,295 A * 6/1993 Hoang .......................... 326/115
(Continued)

FOREIGN PATENT DOCUMENTS

WO    WO 2004/084072    9/2004

OTHER PUBLICATIONS

Blaauw et al., "Statistical Timing Analysis: From Basic Principles to State of the Art", *IEEE Trans. On Computer-Aided Design of Integrated Circuits and Systems*, 2008, pp. 589-607, vol. 27, No. 4.
(Continued)

*Primary Examiner* — Phung M Chung
(74) *Attorney, Agent, or Firm* — Womble Carlyle Sandridge & Rice LLP

(57) ABSTRACT

A sequential circuit with transition error detector including a sequential element with an input that is asserted to the output during the second clock phase of a two phase clock signal, a transition error detector coupled to the sequential element input to assert an error signal if a transition occurs at the sequential element input during the second clock phase but not to assert during the first clock phase, wherein a transition error detection circuit comprises a current mode circuit as a detection circuit for transition timing error detection from signals derived from the sequential element clock signal and input signals.

9 Claims, 4 Drawing Sheets

(51) Int. Cl.
*G01R 31/317* (2006.01)
*H03K 3/012* (2006.01)
*H03K 3/037* (2006.01)

(56) References Cited

U.S. PATENT DOCUMENTS

| | | | | |
|---|---|---|---|---|
| 6,028,454 | A * | 2/2000 | Elmasry et al. | 326/115 |
| 6,484,294 | B1 * | 11/2002 | Kiyoshige | G01R 31/318583 326/101 |
| 6,734,699 | B1 * | 5/2004 | Silver et al. | 326/1 |
| 7,162,661 | B2 * | 1/2007 | Mudge et al. | 714/10 |
| 7,388,407 | B2 * | 6/2008 | Lin et al. | 327/262 |
| 7,821,429 | B2 * | 10/2010 | Yu et al. | 341/101 |
| 8,185,812 | B2 * | 5/2012 | Das et al. | 714/814 |
| 8,301,970 | B2 * | 10/2012 | Bowman et al. | 714/758 |
| 8,390,312 | B2 * | 3/2013 | Rebaud et al. | 326/9 |
| 8,503,595 | B2 * | 8/2013 | Fukuda et al. | 375/375 |
| 8,555,124 | B2 * | 10/2013 | Idgunji | G01R 31/3016 714/731 |
| 2005/0246613 | A1 * | 11/2005 | Blaauw et al. | 714/763 |
| 2007/0162798 | A1 * | 7/2007 | Das et al. | 714/724 |
| 2010/0079184 | A1 | 4/2010 | Bowman et al. | |

OTHER PUBLICATIONS

Choudhury et al., "TIMBER: Time Borrowing and Error Relaying for Online Timing Error Resilience", Design, Automation & Test in Europe Conference & Exhibition, Mar. 8-10, 2010, 6 pages.

Das et al., "RazorII: In Situ Error Detection and Correction for PVT and SER Tolerance", *IEEE J. of Solid-State Circuits*, 2009, pp. 32-48, vol. 44, No. 1.

Tajalli et al., "Subthreshold Source-Coupled Logic Circuits for Ultra-Low-Power Applications", *IEEE J. of Solid-State Circuits*, 2008, pp. 1699-1710, vol. 43, No. 7.

Turnquist et al., "A Timing Error Detection Latch Using Subthreshold Source-Coupled Logic", 2010 Conference on Ph.D. Research in Microelectronics and Electronics (PRIME), Jul. 18-21, 2010, 4 pages.

Valadimas et al., "Timing Error Tolerance in Nanometer ICs", IEEE 16$^{th}$ International On-Line Testing Symposium, Jul. 5-7, 2010, pp. 283-288.

Bowman et al., "Energy-Efficient and Metastability-Immune Resilient Circuits for Dynamic Variation Tolerance," *IEEE Journal of Solid-State Circuits*, 2009, pp. 49-63, vol. 44, No. 1.

Turnquist et al., "Adaptive Sub-Threshold Test Circuit," *NASA/ESA Conference on Adaptive Hardware and Systems*, 2009, pp. 197-203.

* cited by examiner

SEQUENTIAL CIRCUIT WITH CURRENT MODE ERROR DETECTION

BACKGROUND

1. Field of the Disclosure

The invention relates to combinatory logic timing error detection and especially to improvements to subthreshold CMOS devices by a use of a type of new timing error detection circuit.

2. Description of Related Art

In conventional digital design flow, combinational logic delay constraints are static in the sense that the resulting circuit from synthesis must meet the worst case operation condition delays in order to guarantee the circuit operation. If the run-time delay is longer than analyzed during the design time, correct circuit operation cannot be secured. In a conventional design, meeting timing requirements introduces overdesign leading to both area and power—dynamic and static—consumption increase in the system. On the other hand, a timing error detection (TED) system equipped with Error-Detection Sequential (EDS) latches (Bowman, K. A.; et. al. "Energy-Efficient and Metastability-Immune Resilient Circuits for Dynamic Variation Tolerance" IEEE Journal of Solid-State Circuits, Volume: 44, Issue: 1, Page(s): 49-63, 2009) can tolerate late arriving signals from combinational logic. The EDS latch detects late arriving data and reacts to recover from the error. EDS operation is conceptually shown in FIG. 1, where in FIG. 1a a logic stage (102) between two sequential elements (101, 103) is shown. In FIG. 1b, where the signals of the second sequential element (103) are shown, the first transition in D arrives early and does not trigger a conceptual Error signal, whereas the second transition in D arrives late and triggers the Error signal. The Error signal can then be used, for example, to trigger an instruction replay in modern processors. FIG. 2 shows a conventional circuit for error detection, where the data (D) and clock (CLK) inputs of a conventional latch (201) are connected to a transition detector (202) which generates the Error signal when the data transitions within the clock high period (for a positive edge triggered latch).

The minimum energy point for static CMOS logic is in the subthreshold region, where the operating voltage is below the threshold voltage of the CMOS transistors. Although minimum energy operation is achieved, the effect of the variations in modern deep submicron CMOS processes is greatly increased. Subthreshold current is due to diffusion charge transport mechanism and it can be observed that the drain current is exponentially related to the gate-source voltage, drain-source voltage, and thermal voltage. From this exponential relationship it can be seen that, when compared to nominal operating conditions (strong inversion), effects of process variation, supply voltage, and temperature are greatly amplified in the subthreshold operating region.

Combining subthreshold design with TED mitigates the subthreshold design hindrances. Although adding TED circuitry introduces extra energy consumption, the timing error information provided by the TED circuitry can be used to control the circuit operation for better energy efficiency. With TED, circuits can be designed with relaxed timing margin overhead, and dynamic voltage (DVS) or frequency (DFS) scaling can be used alongside error recovery. This works not only from process variance and operating conditions point of view, but a TED system also takes into account data related delay variance issues. However, if the circuits designed for the nominal voltage range are used in the subthreshold range, the size, and thus the energy consumption, of the circuits grows unfeasibly large (Turnquist, M. J.; et. al. "Adaptive Sub-Threshold Test Circuit" NASA/ESA Conference on Adaptive Hardware and Systems, 2009. Page(s): 197-203, 2009).

Subthreshold source-coupled logic (STSCL) can be used to provide both robustness to process, supply voltage and temperature (PVT) variations and reduced power consumption in subthreshold. STSCL has been shown to consume less power than static CMOS for low operation frequencies. Since the delay of an STSCL gate is independent of the threshold voltage (VT), STSCL is more robust to PVT than static CMOS. In addition, STSCL allows for accurate control of gate current consumption and operation frequency. These advantages are all beneficial for TED systems operating in subthreshold where less power overhead, robustness, and ease in adaptability are considered key parameters. As shown in FIG. 3, an STSCL circuit is constructed by a network of differential NMOS pairs comprised of transistors M1,M2 (301), an adjustable PMOS load, transistors M3, M4, (302) with have an output resistance RP, and an adjustable tail current ISS. The NMOS pairs are used to construct logic gates and thus steer ISS between the two PMOS loads. The voltage swing VSW=RP·ISS in STSCL is maintained by balancing the size of RP and magnitude of ISS. Since ISS can be reduced to the pA range in subthreshold, RP needs to be in the low GΩ range to achieve proper VSW. By connecting the bulk of the PMOS load devices to the drain, a large RP is achieved without excessively large transistor lengths. The size of RP and the magnitude of ISS are both adjusted by the Voltage Swing Control (VSC) block (303). The VSC decreases the dependence on global process variations, supply noise, and temperature fluctuations. It is important to recognize that one VSC generates VP and VN for a large number of STSCL gates. The VSC typically consists of an operational amplifier connected to a dummy STSCL circuit.

Error detection principle and error discovery is described in US 2010/079,184 (A1) now U.S. Pat. No. 8,301,970, and in WO2004084072. The general ideas of timing error detection and recovery are not described here in detail. Current mode logic circuits are described in US2009/219,054 (A1) now abandoned.

SUMMARY OF THE DISCLOSURE

One object of the invention is to minimize the effects of sensitivity to PVT variations of the device and timing error detection. The invention allows use of for example subthreshold CMOS circuits, and it allows also larger voltage and temperature tolerances.

Modern digital design flow CAD tools do not support STSCL, which forces STSCL to be designed by hand. Accordingly, a new approach is required. This approach should integrate the robustness of STSCL but can be placed within the conventional digital design flow. The purpose of our invention is also to overcome the aforementioned problems.

The object is achieved by a circuit according to the claim 1.

DETAILED DESCRIPTION

Figure 1A:
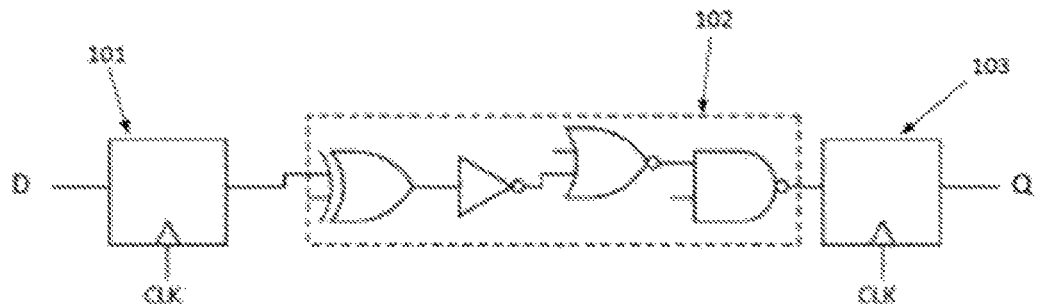
FIG. 1(a) is a conceptual diagram showing a logic stage between two sequential elements.
Figure 1:
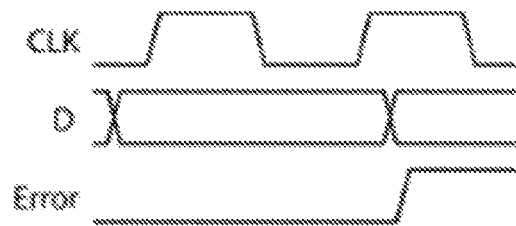
FIG. 1(b) is a timing diagram showing the concept of timing error detection.
Figure 2:
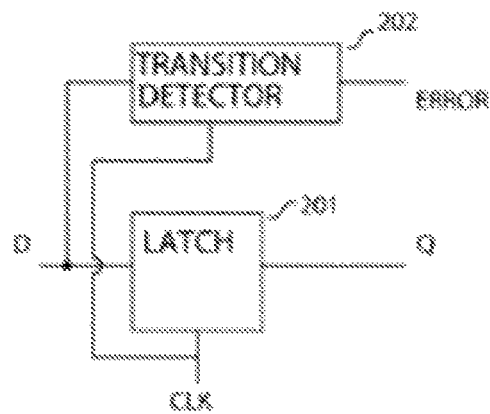
FIG. 2 is a schematic diagram of a previous nominal voltage sequential circuit with error detection
Figure 3:
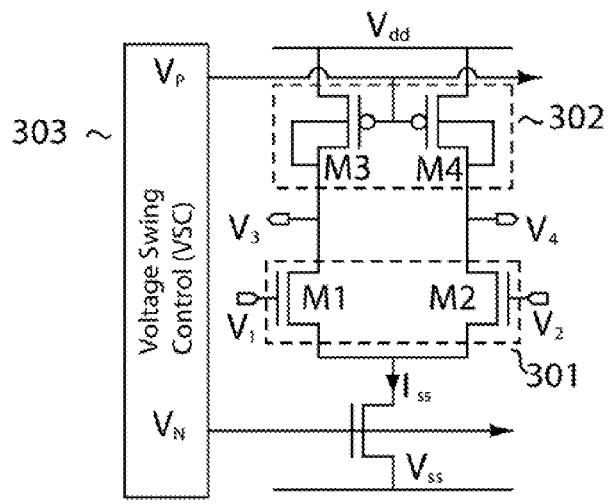
FIG. 3 is a conceptual schematic diagram of a STSCL inverter.
Figure 4:
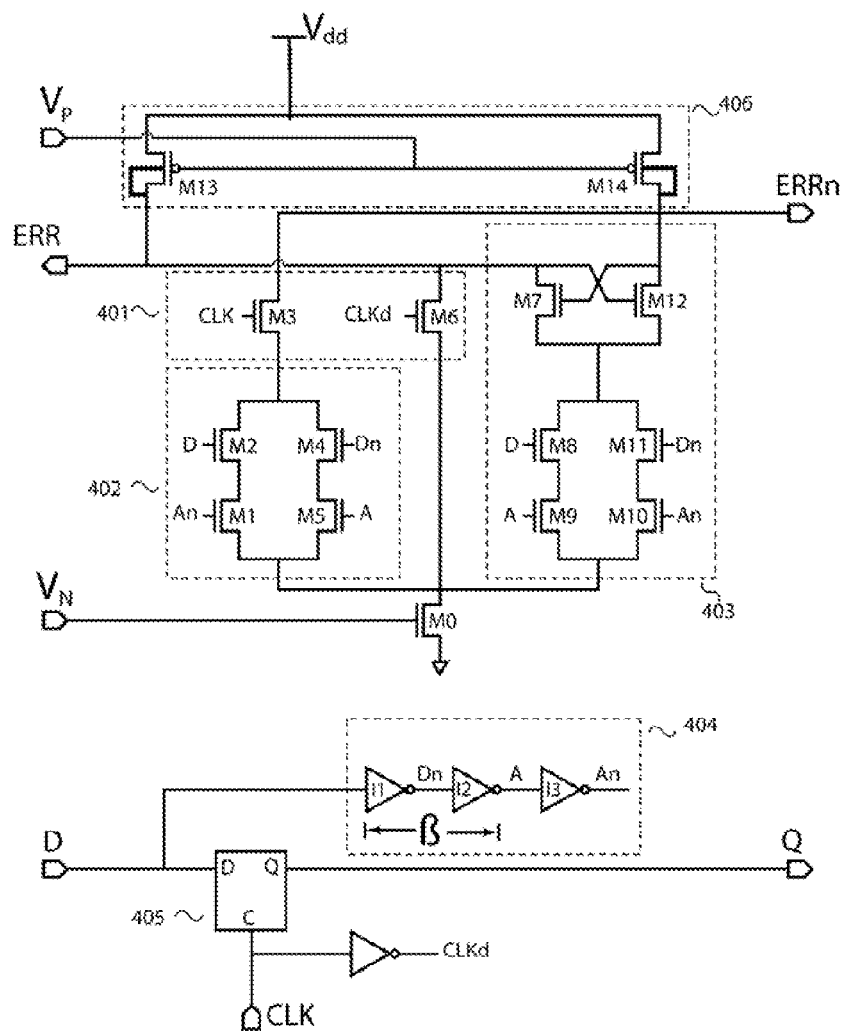
FIG. 4(a) is a schematic diagram of a sequential logic element with current mode error detection in accordance with some embodiments.
FIG. 4(b) is a timing diagram for the circuit of FIG. 4(a) in accordance with some embodiments.
Figure 4:
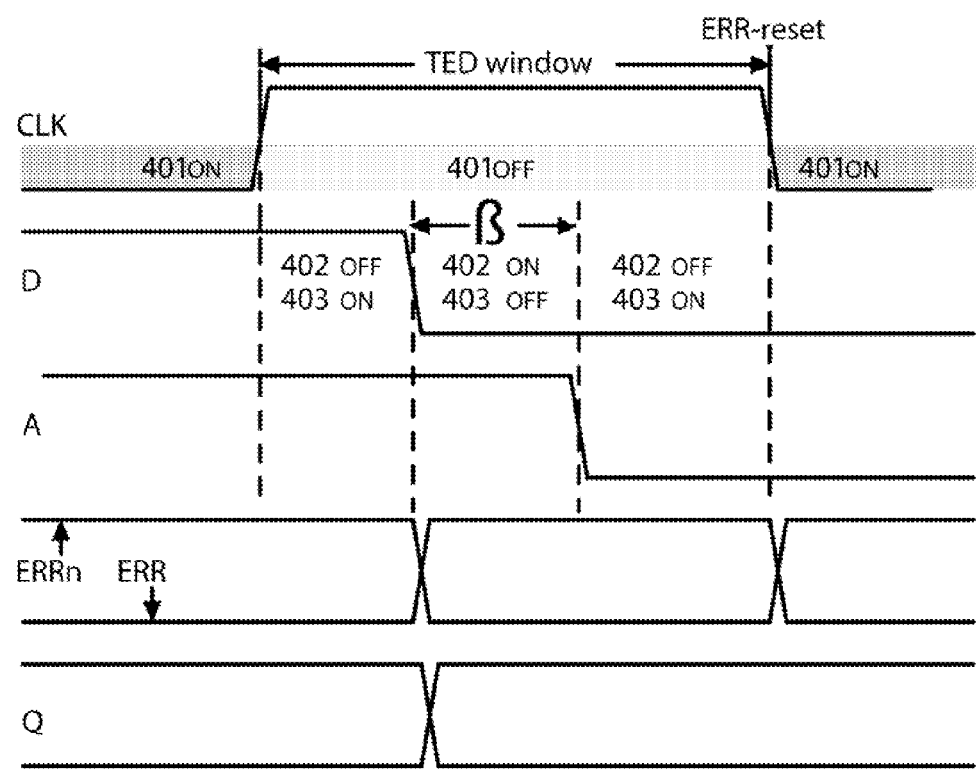

An embodiment of our invention, a Sequential Circuit with Current Mode Error Detection (SCCMED), is shown in FIG. 4a. This circuit, described in more detail below, may be used, for example, to replace traditional master slave flip flop circuits in the critical paths of pipelined logic. The error detection feature can then be further used to attain gain in performance, power, and/or yield. The use of current-mode avoids the power and performance penalty of using conventional circuits designed for nominal operating voltage ranges. As only the error detection is designed with current mode logic, it is simple to integrate the circuit into a static CMOS logic pipeline which has been designed with conventional CAD digital design flow.

The block diagram of the Current Mode Sequential Circuit with Error Detection is shown in FIG. 4(a). It generally consists of a current mode transition detector (401, 402, 403), a delay line (404), a sequential element such as a latch (405), a load (406), and a delayed clock signal (CLKd).

Although the latch 405 of the figure is a positive edge triggered latch, it should be appreciated that any type of latch (for example negative edge triggered) can be used without any loss of generality. The latch input is connected to the critical path of the logic (D) of which the timing errors are to be detected. The error detection according to invention may be used with any sequential element with suitable timing requirements for the TED-device.

The delay line (404) consists of three delay stages, which can be, but are not limited to, conventional static CMOS inverters or SCSTL inverters. The function of the delay line is to pass on the critical path signal D to the transition detector in three delayed stages. The delay line may be made of alike gates as the element 404, resulting to alike delays temperature and voltage dependencies as in the element 404. The delays may also controllable, for example by controlling the current.

The transition detector includes a timing error reset switch (401), consisting of transistors M3 and M6, a pulldown network switch (402) (transistors M1, M2, M4, M5), and a latching switch (403) (transistors M7, M8, M9, M10, M11, M12). The function of the combination of the load line 406 and transition detector 401, 402, 403 is to recognize a transition of D during the time CLK is high. A transition of D during CLK high generates a differential timing error (i.e. ERR goes high and ERRn low). This is the result of (402) pulling ERRn low and 403 being OFF. After a transition of D is complete, 403 is ON and keeps ERR high and ERRn low until a negative CLK edge. The functionality of Error Detection can be further explained with the help of FIG. 4(b). As CLK goes low to high, D stays high and Dn=An=low and A=high. In other words, 403 is ON and 402 is OFF. Transistors M7 and M12 ensure that ERR is latched low during this time. After D transitions from high to low, a number of events happen during the delay 8. First, 403 shuts OFF since D=An=low. This cuts off the path to ground for M7 and M12 thus helping to drive the ERR signal high. Secondly, after a small delay through I1, both 402 and M3 turn ON since Dn=A=high and CLK=high. This event drives ERRn low through 402. 402 stays ON for the delay of β. At the end of β, 402 turns OFF and 403 ON. The ERR stays high until an error reset (ERR-reset) is performed using 401. At the negative edge of CLK, M3 shuts OFF thus driving the ERRn node high. At the same time, M6 turns ON and pulls the ERR node low. The ERR-reset condition continues for the entire time CLK is low since detecting a transition of D during this time is insignificant for a TED pipeline.

The term "transistor" here encompasses both N-type and P-type metal oxide field effect (MOS) transistors. Further encompassed are MOS transistors, where different parameters such as VT, material type, gate size and configuration, insulator thickness, etc. are varied. The term "transistor" can also include other FET-type and bipolar-junction transistors and other types of transistors known to those skilled in the art related to the present disclosure.

Figure 5:
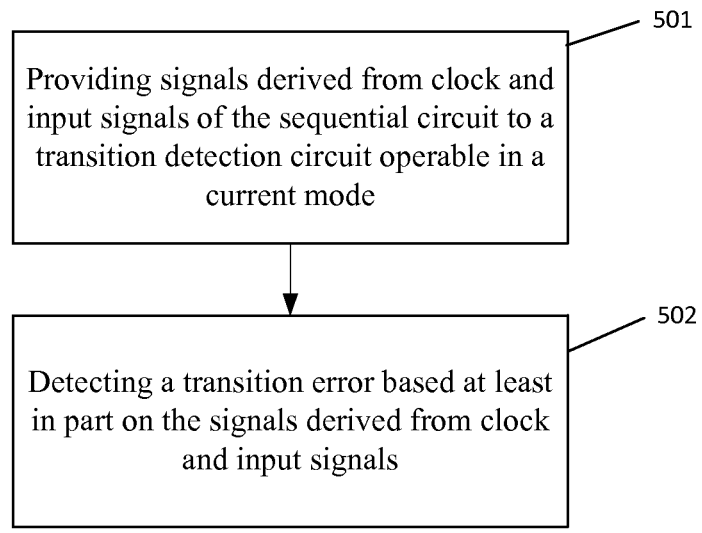
FIG. 5 is a schematic block diagram of a method for detecting a transition error in a sequential circuit according to some embodiments of the present disclosure.

Aspects of the present invention also provide for a method detecting a transition error in a sequential circuit. As shown in FIG. 5, the method may include providing signals derived from a clock and input signals of the sequential circuit to a transition detection circuit operable in a current mode (Block 501). Further, the method may include detecting a transition error based at least in part on the signals derived from the clock and input signals (Block 502).

The invention claimed is:

1. A sequential circuit with transition error detector, comprising:
    a sequential element with an input signal that is asserted to an output during a second clock phase of a two phase clock signal; and
    a transition error detector coupled to the sequential element input signal, the transition error detector configured to assert an error signal if a transition occurs at the sequential element input signal during the second clock phase and configured to not assert the error signal during a first clock phase, wherein the transition error detector further comprises a current mode logic circuit as a transition error detection circuit configured to detect at least one transition timing error from signals derived from at least one of the sequential element two phase clock signal or input signal.

2. The sequential circuit of claim 1 further comprising a delay line for generating delayed versions of the sequential element input signal for the current mode transition error detection circuit and a delay for generating a delayed sequential element two phase clock signal for the current mode transition error detection circuit.

3. The sequential circuit of claim 1, wherein the current mode transition error detection circuit comprises a differential transistor circuit.

4. The sequential circuit of claim 3, wherein the current mode transition error detection circuit comprises a source coupled current mode logic circuit.

5. The sequential circuit of claim 4, wherein the current mode transition error detection circuit comprises a subthreshold source coupled current mode logic circuit.

6. The sequential circuit of claim 1, wherein the sequential element input and output are part of a digital pipelined logic stage.

7. The sequential circuit of claim 1, wherein the sequential element comprises a subthreshold voltage current mode logic.

8. The sequential circuit of claim 1, wherein one path of differential operation in the current mode transition error detection circuit is activated during the second phase of the two phase clock signal when there is a transition in a latch input signal.

9. The sequential circuit of claim 1, wherein one path of differential operation in the current mode transition error detection circuit is activated during the first phase of the two phase clock signal or during the second phase of the two phase clock signal if there is no transition in a latch input signal.

* * * * *